US009184753B2

(12) United States Patent
Shin

(10) Patent No.: US 9,184,753 B2
(45) Date of Patent: Nov. 10, 2015

(54) DOUBLE DATA RATE COUNTER, AND ANALOG-TO-DIGITAL CONVERTER AND CMOS SENSOR INCLUDING THE SAME

(71) Applicant: SK hynix Inc., Gyeonggi-do (KR)

(72) Inventor: Min-Seok Shin, Gyeonggi-do (KR)

(73) Assignee: Sk Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/329,599

(22) Filed: Jul. 11, 2014

(65) Prior Publication Data

US 2015/0171871 A1    Jun. 18, 2015

(30) Foreign Application Priority Data

Dec. 12, 2013  (KR) .................... 10-2013-0154404

(51) Int. Cl.
| | |
|---|---|
| *H03M 1/34* | (2006.01) |
| *H03K 21/02* | (2006.01) |
| *H04N 5/3745* | (2011.01) |
| *H04N 5/369* | (2011.01) |
| *H03K 21/38* | (2006.01) |
| *H03K 23/50* | (2006.01) |

(52) U.S. Cl.
CPC ............ *H03K 21/023* (2013.01); *H03K 21/026* (2013.01); *H03M 1/34* (2013.01); *H04N 5/3698* (2013.01); *H04N 5/37455* (2013.01); *H03K 21/38* (2013.01); *H03K 23/50* (2013.01)

(58) Field of Classification Search
CPC ......... H03M 1/12; H04N 5/378; H03K 21/38; H03K 21/026
USPC ................ 341/140–166; 250/208.1; 377/107; 348/308, 340, E5.024
See application file for complete search history.

(56) References Cited

U.S. PATENT DOCUMENTS

| | | | | |
|---|---|---|---|---|
| 7,990,304 | B2 * | 8/2011 | Lim et al. ....................... | 341/164 |
| 8,261,160 | B1 * | 9/2012 | Nykter et al. .................. | 714/775 |
| 8,362,818 | B2 * | 1/2013 | Suzuki .......................... | 327/175 |
| 8,395,539 | B2 * | 3/2013 | Lim et al. ...................... | 341/169 |
| 8,586,903 | B2 * | 11/2013 | Itzhak et al. ............... | 250/208.1 |
| 8,976,052 | B2 * | 3/2015 | Kim et al. ..................... | 341/155 |
| 2010/0225796 | A1 | 9/2010 | Lim et al. | |

* cited by examiner

*Primary Examiner* — Lam T Mai
(74) *Attorney, Agent, or Firm* — IP & T Group LLP

(57) ABSTRACT

A double data rate (DDR) counter includes a first control block suitable for toggling a counter clock according to a count mode signal and a previous state value of a sampling block; a second control block suitable for determining whether to toggle a clock signal inputted to a counting block corresponding to an (LSB+1) bit or higher; a third control block suitable for determining an enable period of the counting block; the sampling block suitable for sampling a state of the clock signal and outputting an LSB value, when an input signal transits; and the counting block suitable for performing counting according to output signals of the second and third control blocks and outputting a counter output signal having the (LSB+1) bit or higher.

11 Claims, 7 Drawing Sheets

US 9,184,753 B2

DOUBLE DATA RATE COUNTER, AND ANALOG-TO-DIGITAL CONVERTER AND CMOS SENSOR INCLUDING THE SAME

CROSS-REFERENCE TO RELATED APPLICATIONS

The present application claims priority of Korean Patent Application No. 10-2013-0154404, filed on Dec. 12, 2013, which is incorporated herein by reference in its entirety.

BACKGROUND

1. Field

Exemplary embodiments of the present invention relate to an image sensor and, more particularly, to a double data rate (DDR) counter for supporting digital double sampling (DDS), an analog-to-digital converting apparatus and a complementary metal oxide semiconductor (CMOS) image sensor including the same.

Digital double sampling is excellent at removing offset in single slope analog-to-digital converters (ADC). In the embodiments of the present invention, a single slope ADC will be used as an example. However, the present invention may be applied in various mechanisms, including double data rate counters.

2. Description of the Related Art

Counters are used in various electronic devices for converting physical quantities, such as light intensity, sound intensity, or time into a digital signal.

Image sensors absorb incident light on a pixel array and create an analog signal. The analog signal then needs to be transformed into a digital signal for data transfer, processing, and storage. This requires the use of an analog-to-digital converter (ADC). The ADC may be implemented with a counter that performs a counting operation using a dock.

The operating speed and power consumption of the counter has a direct influence on the performance of the system or device in which it is incorporated. In particular, CMOS image sensors often include a plurality of counters to convert analog signals, outputted from an active pixel sensor array column by column, into digital signals. The number of counters may be increased to increase the resolution of the CMOS image sensor. As the number of counters increases, the operation speed and power consumption of the counters become an important factor in determining overall performance of the image sensor.

With the increase in resolution and frame rate of CMOS images sensors, the amount of data to be processed within the CMOS image sensor has increased. Most common CMOS image sensors use a single slope ADC to, convert analog voltages from pixels into digital values. In particular a single slope ADC based on column parallel readout architecture significantly reduces the analog-to-digital conversion rate, has low power consumption, and occupies a small area.

The single slope analog-digital conversion time is determined by $1/fclk*2^N$ where N represents analog-digital conversion resolution and fclk represents the frequency of the single slope ADC. Thus, with an increase in resolution and frame rate of the CMOS image sensor, the frequency fclk of the single slope ADC needs to be increased as well. However, increases in the frequency may increase the parasitic RC (RC delay) of the clock signal and thus increase power consumption. Furthermore, the physical limits of the RC time constant make it difficult to operate at a high clock speed.

Thus, DDR counting techniques have been proposed to reduce the clock speed of single slope ADCs, DDR counting techniques include a first DDR counting method using a logic level of a sampled clock as the least significant bit (LSB) data and a second DDR counting method using an XOR circuit. As the DDR counter and the first DDR counting method use a clock as the LSB data, the DDR counter has lower power consumption than the DDR counter using an XOR circuit based on the second DDR counting method because the logic gates are required to toggle less often.

However, the above-described DDR counting techniques have a disadvantage in that a bit-wise inversion (BWI) counter or up-down counter is required. Furthermore, each of the counters has a structure in which a logic gate is provided between T flip-flops included in the counter. In this case, the area of the counter is increased and a logic gate is additionally used in the counting signal path and thus increases power consumption.

Conventional DDR counters, in which a rising edge appears first, may be applied to BWI technology for performing digital double sampling (DDS).

The conventional DDR counter may not be applied to the DDS counting methods using only up-counting or down-counting. This is because one of two counting operations is first performed at a falling edge of the clock signal at all times. Further ore, the BWI method includes a multiplexer used for each cell and a D flip-flop used for a control block. Thus, the area of the counter is inevitably increased.

On the other hand, conventional single-direction counting techniques do not require a logic gate between T flip-flops and have a simple structure. However, there are currently no DDR counters suitable for single-direction counting techniques.

SUMMARY

Various embodiments are directed to a DDR counter suitable for a single-direction counting technology that reduces power consumption and area, and an analog-to-digital converting apparatus and a CMOS image sensor including the same.

In an embodiment, a double data rate (DDR) counter may include: a first control block suitable for toggling a counter clock according to a count mode signal and a previous state value of a sampling block; a second control block suitable for determining whether to toggle a clock signal inputted to a counting block corresponding to an (LSB+1) bit or higher; a third control block suitable for determining an enable period of the counting block; the sampling block suitable for sampling a state of the clock signal and outputting an LSB value, when an input signal transits; and the counting block suitable for performing counting according to output signals of the second and third control blocks and outputting a counter output signal having the (LSB+1) bit or higher.

In an embodiment, a DDR counter may include: a control block suitable for determining whether to toggle a clock signal between a first counting operation and a second counting operation; and a counting block suitable for performing counting from an (LSB+1) bit at rising edges of the clock signal during the first counting operation and performing counting from the (LSB+1) bit at falling edges of the clock signal during the second counting operation.

In an embodiment, an analog-to-digital converting apparatus may include: a comparator suitable for comparing an analog signal to a reference signal and generating a comparator output signal; and a DDR counter suitable for generating a digital signal corresponding to the analog signal according to the comparator output signal. The DDR counter may include: a first control block suitable for toggling a counter clock according to a count mode signal and a previous state value of a sampling block; a second control block suitable for determining whether to toggle a clock signal inputted to a counting block corresponding to an (LSB+1) bit or higher; a third control block suitable for determining an enable period of the counting block; the sampling block suitable for sampling a state of the clock signal and outputting an LSB value, when the comparator output signal transits; and the counting block suitable for performing counting according to output signals of the second and third control blocks and outputting a counter output signal having the (LSB+1) bit or higher.

In an embodiment, an analog-to-digital converting apparatus may include: a comparator suitable for comparing an analog signal to a reference signal and generating a comparator output signal; and a DDR counter suitable for generating a digital signal corresponding to the analog signal according to a comparator output signal from the comparator. The DDR counter may include: a control block suitable for determining whether to toggle a clock signal between a first counting operation and a second counting operation; and a counting block suitable for performing counting at rising edges of the clock signal from an (LSB+1) bit during the first counting operation, and performing counting at falling edges of the clock signal from the (LBS+1) bit during the second counting operation.

In an embodiment, a CMOS image sensor may include: a pixel array suitable for generating an analog signal; a comparator suitable for comparing the analog signal to a reference signal and generating a comparator output signal; a DDR counter suitable for generating a digital signal corresponding to the analog signal according to the comparator output signal; and a control unit suitable for controlling operations of the sensing unit, the comparator and the DDR counter. The DDR counter may include: a first control block suitable for toggling a counter clock according to a count mode signal and a previous state value of a sampling block; a second control block suitable for determining whether to toggle a clock signal inputted to a counting block corresponding to an (LSB+1) bit or higher; a third control block suitable for determining an enable period of the counting block; the sampling block suitable for sampling a state of the clock signal and outputting an LSB value, when a comparator output signal transits; and the counting block suitable for performing counting according to output signals of the second and third control blocks and outputting a counter output signal corresponding to the (LSB+1) bit or higher.

In an embodiment, a CMOS image sensor may include: a pixel array suitable for generating an analog signal; a comparator suitable for comparing the analog signal to a reference signal and generating a comparator output signal; a DDR counter suitable for generating a digital signal corresponding to the analog signal according to the comparator output signal; and a control unit suitable for controlling operations of the sensing unit, the comparator and the DDR counter. The DDR counter may include: a control block suitable for determining whether to toggle a clock signal between a first counting operation and a second counting operation; and a counting block suitable for performing counting at rising edge s of the clock signal from an (LSB+1) bit during the first counting operation, and performing counting at falling edges of the clock signal from the (LSB+1) bit during the second counting operation.

DETAILED DESCRIPTION

Figure 1:
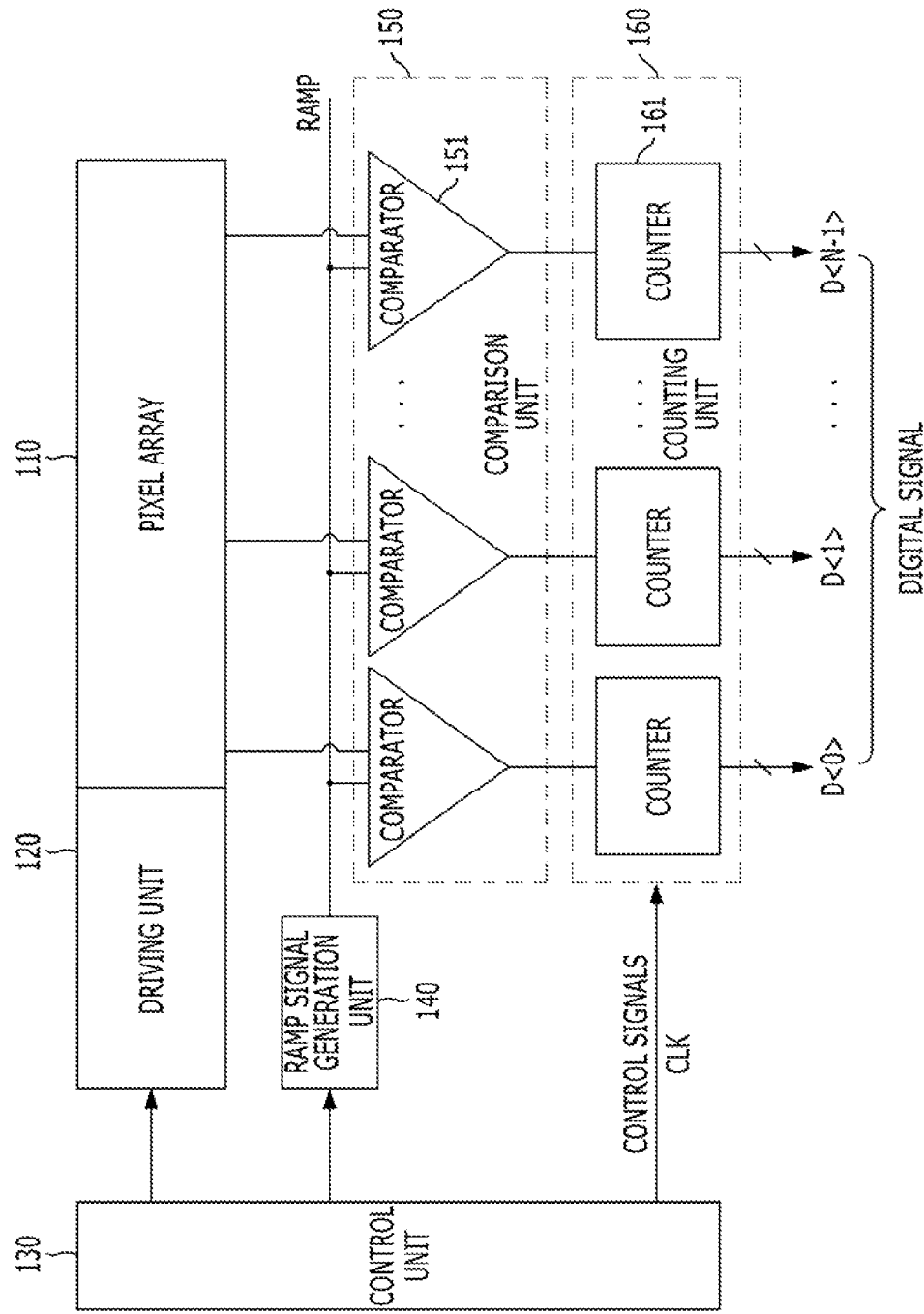
FIG. 1 is a block diagram illustrating a CMOS image sensor.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts in the various figures and embodiments. In this document, the word "embodiment(s)" refers to embodiments of the present invention or inventive concept.

Throughout the specification, when an element is referred to as being "coupled" to another element, the element may be "directly coupled" to the other element and/or "electrically coupled" to the other element with additional elements interposed therebetween. Furthermore, when and embodiment "comprises" (or "includes" or "has") some elements, it should be understood that it may include (or include or has) only those elements, or it may include (or include or have) additional elements unless expressly stated otherwise. The singular form may include the plural form, and vice versa, unless expressly stated otherwise.

FIG. 1 is a block diagram illustrating a CMOS image sensor including a general single data rate counter.

Referring to FIG. 1, the CMOS image sensor includes a pixel array 110, a driving unit 120, a control unit 130, a ramp signal generation unit 140, a comparison unit 150, and a counting unit 160.

The pixel array 110 includes a plurality of pixels, which are arranged to convert incident light into electrical analog signals. The driving unit 120 may include a driver and an address decoder, and may control the operation of the pixel array by a unit of a row and/or a column. The control unit 130 generates a clock CLK and control signal's for controlling operation timing of the counting unit 160. The clock CLK and control signals generated in the control unit 130 may include a count clock signal CNT_CLK, a count mode signal CNT_MODE, a flip-flop initialization signal INIT and the like. The ramp signal generation unit 140 generates a ramp signal RAMP, which is used in the comparison unit 150 as a reference signal, according to the control of the control unit 130.

The analog pixel signal from the pixel array 110 is compared to the ramp signal RAMP reference signal) generated in the ramp signal generation unit 140, and converted into a digital signal D<0:N−1> by counting the compared result, by an analog-to-digital converting apparatus ADC including the comparison unit 150 and the counting unit 160. The analog pixel signal may be outputted and processed by a unit of a column. For this operation, the comparison unit 150 and the counting unit 160 may include a plurality of comparators 151 and a plurality of counters 161, respectively. The comparators 151 and the counters 161 may process pixel signals corresponding to a row in parallel at the same time. Thus, the CMOS image sensor may exhibit excellent band performance and noise characteristics, and may operate at a high speed.

Figure 2:
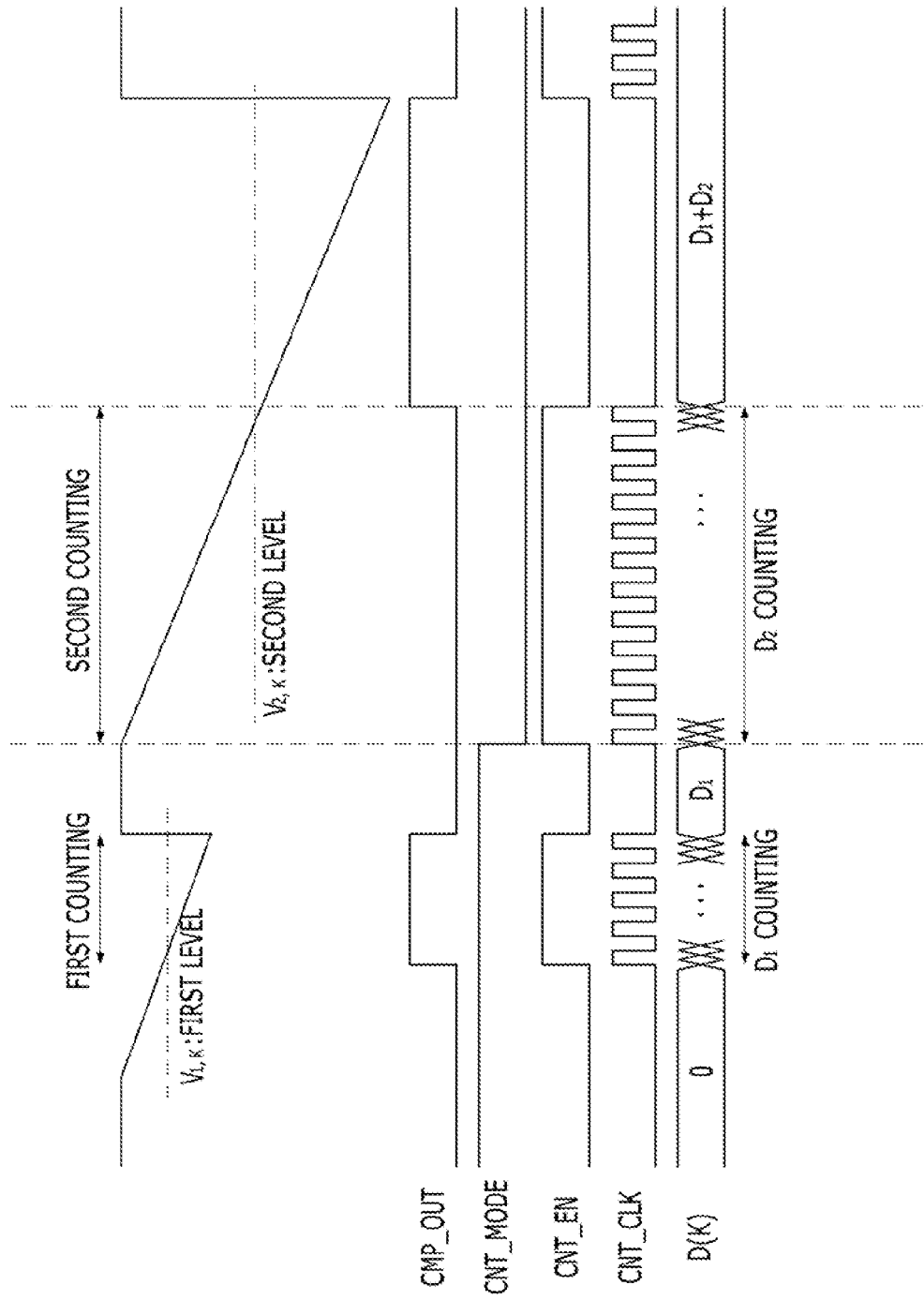
FIG. 2 is a timing diagram for explaining digital double sampling (DDS).

The pixel array 110 sequentially outputs a first analog signal indicating a reset component for correlated-double sampling (CDS) and a second analog signal indicating an image signal component, which includes a reset component, and the analog-to-digital converting apparatus including the comparison unit 150 and the counting unit 160 digitally performs CDS, (i.e., DDS) based on the first and second analog signals (refer to FIG. 2). The DDS is used to remove deviations among columns of a single slope ADC having a column-parallel structure.

The analog-to-digital converting apparatus counts the first analog signal indicating a reset component, and then counts the second analog signal indicating an image signal component. Based on the two counting results, a digital signal is generated, which corresponds to a difference between the first and second analog signals.

FIG. 2 is a timing diagram for explaining DDS. In FIG. 2, "CMP_OUT" represents a comparator output signal outputted from the comparator 151, "CNT_MODE" represents a count mode signal indicating a count mode and determined by the control unit 130, "CNT_EN" represents a count enable signal for enabling count operation, "CNT_CLK" represents a count clock signal determined by the control unit 130, and "D(k)" represents an output signal outputted from the counter 161.

As illustrated in FIG. 2, a first analog signal, which includes only a reset component and is first outputted, is counted to use the first analog signal as a reference signal (first counting), and a second analog signal, which includes a reset component and a pure image signal, is then counted (second counting). Then, the value obtained by counting the first analog signal may be subtracted from the value obtained by counting the second analog signal, in order to acquire the pure image signal from which the reset component is removed. Thus, it may be possible to remove an offset error which occurs in the analog-to-digital converting apparatus having a column-parallel structure or a pixel array.

In the single-direction counting method, however, the period in which the output of the comparator 151 is high may be counted during the first counting operation, and the period in which the output of the comparator is low may be counted during the second counting operation, without storing the first and second analog signals and subtracting the counting value. Thus, a number of additional logics required for up or down-counting or the BWI method are not used, but only a simple additional logic (for example, a control block 310 of FIG. 3) may be used to implement a counter which is used for the single-direction counting method (refer to FIG. 3).

Figure 3:
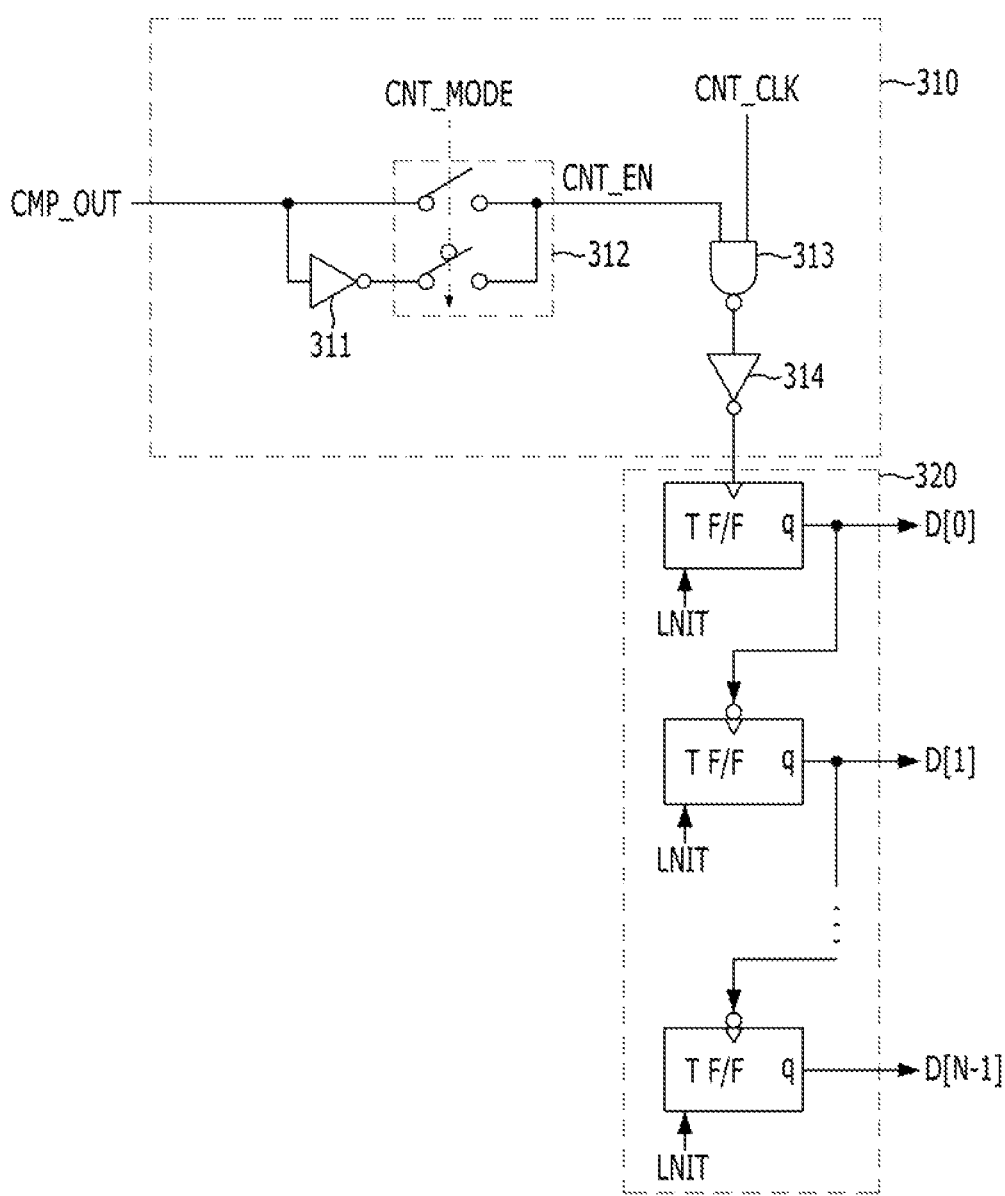
FIG. 3 is a diagram illustrating a counter for a single-direction counting.

FIG. 3 is a diagram illustrating a counter for the single-direction counting.

As illustrated in FIG. 3, counting unit 160 used for the single-direction counting method includes a control block 310 and a counting block 320. The control block 310 receives a comparator output signal CMP_OUT from a comparator 151, generates the count enable signal CNT_EN according to the count mode signal CNT_MODE provided from the control unit 130, and controls a counting enable period in response to the count enable signal CNT_EN. The counting block 320 performs counting according to the count enable signal CNT_EN from the control block 310, and outputs a counter output signal D(k).

The control block 310 includes a first inverter 311, a switch 312, a NAND gate 313, and a second inverter 314. The first inverter 311 inverts the comparator output signal provided from the comparator 151. The switch 312 selects the comparator output signal provided from the comparator 151 or the comparator output signal inverted by the first inverter 311 as the count enable signal according to the count mode signal CNT_MODE from the control unit 130. The NAND gate 313 performs a NAND operation on the count enable signal provided from the switch 312 and the count clock signal CNT_CLK provided from the control unit 130. The second inverter 314 inverts an output signal of the NAND gate 313 and outputs the inverted signal to the counting block 320.

The counting block 320 may include a plurality of T flip-flops. The plurality of T flip-flops are initialized by a flip-flop initialization signal INIT and shifts the count clock signal CNT_CLK to the output counter output signal D(k).

As such, the counter used in the single-direction counting method may use only a simple logic (for example, the switch 312 of FIG. 3) to control the counting enable period.

Figure 4:
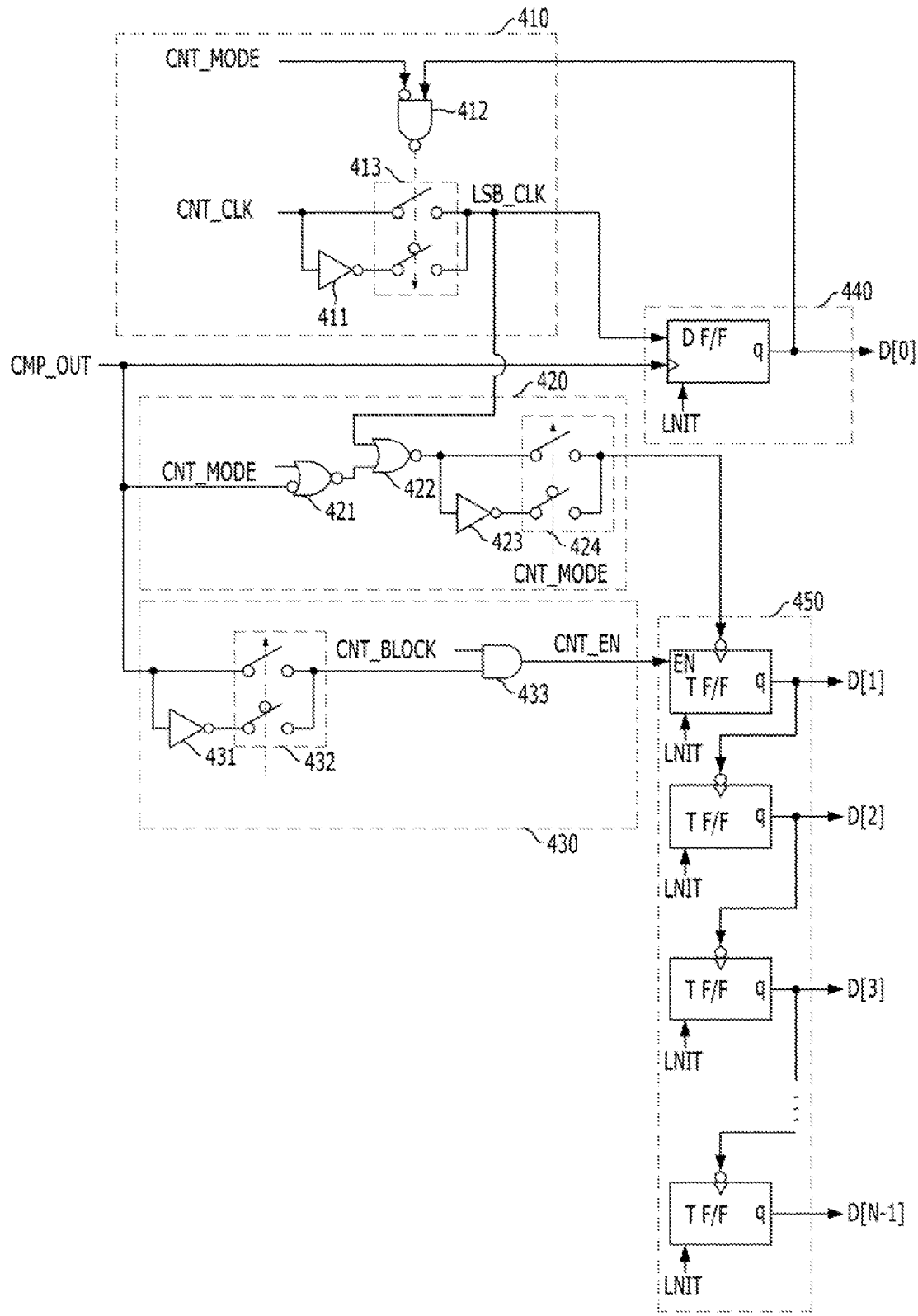
FIG. 4 is a diagram illustrating a DDR counter for a single-direction counting in accordance with an embodiment of the present invention.

FIG. 4 is a diagram illustrating a DDR counter for a single-direction counting in accordance with an embodiment of the present invention.

As described above, the conventional DDR counter uses a method of sampling a clock at the end. Thus, the conventional DDR counter may not perform a counting operation after transition of a CDS circuit.

The embodiment of the present invention proposes a DDR counter having a clock sampling structure. When a first counting operation is performed, a T flip-flop corresponding to the (LSB+1) bit operates at a rising edge at all times. Furthermore, when a second counting operation is performed according to the value of the LSB, an input clock of the T flip-flop corresponding to the (LSB+1) bit is inverted or maintained by a first control block 410 and a second control block 420. Finally, during the second counting, the clock of the T flip-flop corresponding to the (LSB+1) bit is inverted to control the T flip-flop to operate at a failing edge. As illustrated in FIG. 4, the DDR counter in accordance with the embodiment of the present invention includes the first control block 410, the second control block 420, a third control block 430, a sampling block 440, and a counting block 450. The first control block 410 toggles a counter clock according to the count mode signal CNT_MODE and a previous state value of the sampling block 440. The second control block 420 determines whether to toggle a clock signal inputted to the counting block 450 corresponding to the (LSB+1) bit or higher. The third control block 430 determines an enable period and a disable period of the counting block 450. The sampling block 440 samples the state of the clock signal and outputs the LSB value when the comparator output signal CMP_OUT transits. The counting block 450 performs counting according to the output signals of the second and third control blocks 420 and 430 and outputs a counter output signal having the (LSB+1) bit or higher.

The first control block 410 serves to toggle the counter clock according to the counter mode signal and the previous state value of the D flip-flop of the sampling block 440. The count mode signal CNT_MODE '1' indicates first counting, and the count mode signal CNT_MODE '2' indicates second counting. The first control block 410 includes an inverter 411, a NAND gate 412, and a switch 413. The inverter 411 inverts a count clock signal CNT_CLK provided from a control unit 630 of FIG. 5. The NAND gate 412 performs a NAND operation on a signal obtained by inverting a count mode signal CNT_MODE provided from the control unit 630 and the previous state value of the sampling block 440. The switch 413 selects the count clock signal provided from the control unit 630 or the count clock signal inverted by the inverter 411 as the LSB clock signal LSB_CLK according to the output signal of the NAND gate 412.

The second control block 420 may determine whether to toggle a clock signal inputted to a T flip-flop of the counting block 450 corresponding to the (LSB+1) bit. The second control block 420 may include a first NOR gate 421, a second NOR gate 422, an inverter 423, and a switch 424. The first NOR gate 421 performs a NOR operation on the count mode signal CNT_MODE provided from the control unit 630 of FIG. 5 and a signal obtained by inverting a comparator output signal provided from a comparator 651 of FIG. 5. The second NOR gate 422 performs a NOR operation on the LSB clock signal LSB_CLK provided from the first control block 410 and an output signal of the first NOR gate 421. The inverter 423 inverts an output signal of the second NOR gate 422. The switch 424 selects the output signal of the second NOR gate 422 or the signal inverted by the inverter 423 as the clock signal inputted to the T flip-flop of the counting block 450 according to the count mode signal CNT_MODE from the control unit 630.

The third control block 430 may determine an enable period and a disable period of the T flip-flop of the counting block 450. The third control block 430 includes an inverter 431, a switch 432, and a AND gate 433. The inverter 431 inverts the comparator output signal provided from the comparator 651 of FIG. 5. The switch 432 selects the comparator output signal provided from the comparator 651 of FIG. 5 or the comparator output signal inverted by the inverter 431 according to the count mode signal CNT_MODE provided from the control unit 630. The AND gate 433 performs an AND operation on the signal selected by the switch 432 and a count blocking signal CNT_BLOCK provided from the control unit 630 and outputs the count enable signal to the to the T flip-flop of the counting block 450. The count blocking signal prevents false counting during clock toggling between first and second counting operations.

The sampling block 440 may be implemented with one D flip-flop, for example. The D flip-flop may be used to sample the state of the clock signal when the comparator output signal transits, and an output value of the D flip-flop becomes the LSB of the DDR counter.

The counting block 450 may be implemented with a plurality of T flip-flops, for example.

Now, the operation of the DDR counter in accordance with the embodiment of the present invention will be described in more detail.

During the first counting operation, a counting operation using the T flip-flop which starts from the (LSB+1) bit according to the count mode signal CNT_MODE may be performed at a rising edge. That is, when the value of the comparator output signal transits from a low level to a high level during the first counting operation, the D flip-flop of the sampling block 440 samples the state of the clock signal, and the counting block 450 corresponding to the (LSB+1 bit or higher performs counting in synchronization with a rising edge, regardless of the sampling.

Then, during the time between the first and second counting operations, the count mode signal CNT_MODE transits from 1 to 0. Whether to toggle the LSB clock signal LSB_CLK is determined according to the LSB value during the first counting. For example, when the LSB of the first counting is 1, the LSB clock signal is toggled, and when the LSB of the first counting is 0, the LSB clock signal is not toggled.

The T flip-flop of the counting block 450 corresponding to the (LSB+1) bit is disabled so that the counting operation for the (LSB+1) bit or higher is not performed, according to the transition of the clock signal. This operation is performed by the third control block 430 according to the count blocking signal CNT_BLOCK. The count blocking signal is determined by the control unit 630 of FIG. 5 and is used to stop a counting operation.

The second counting operation is performed when the comparator output signal is low. However, all of the counting operations for the (LSB+1) bit or less are performed at falling edges. Even during the second counting operation, the D flip-flop of the sampling block 440 samples the state of the clock signal when the comparator output signal transits from a low level to a high level and the sampled value becomes the value of the LSB.

As described above, the DDR counter in accordance with the embodiment may be used in a DOS counting method which uses only up or down-counting. The DDR counter may halve the input frequency to reduce the power consumption of the counter by about 50%, and relieve the speed limitation caused by an RC load of a clock signal line in a column-parallel readout structure.

Figure 5:
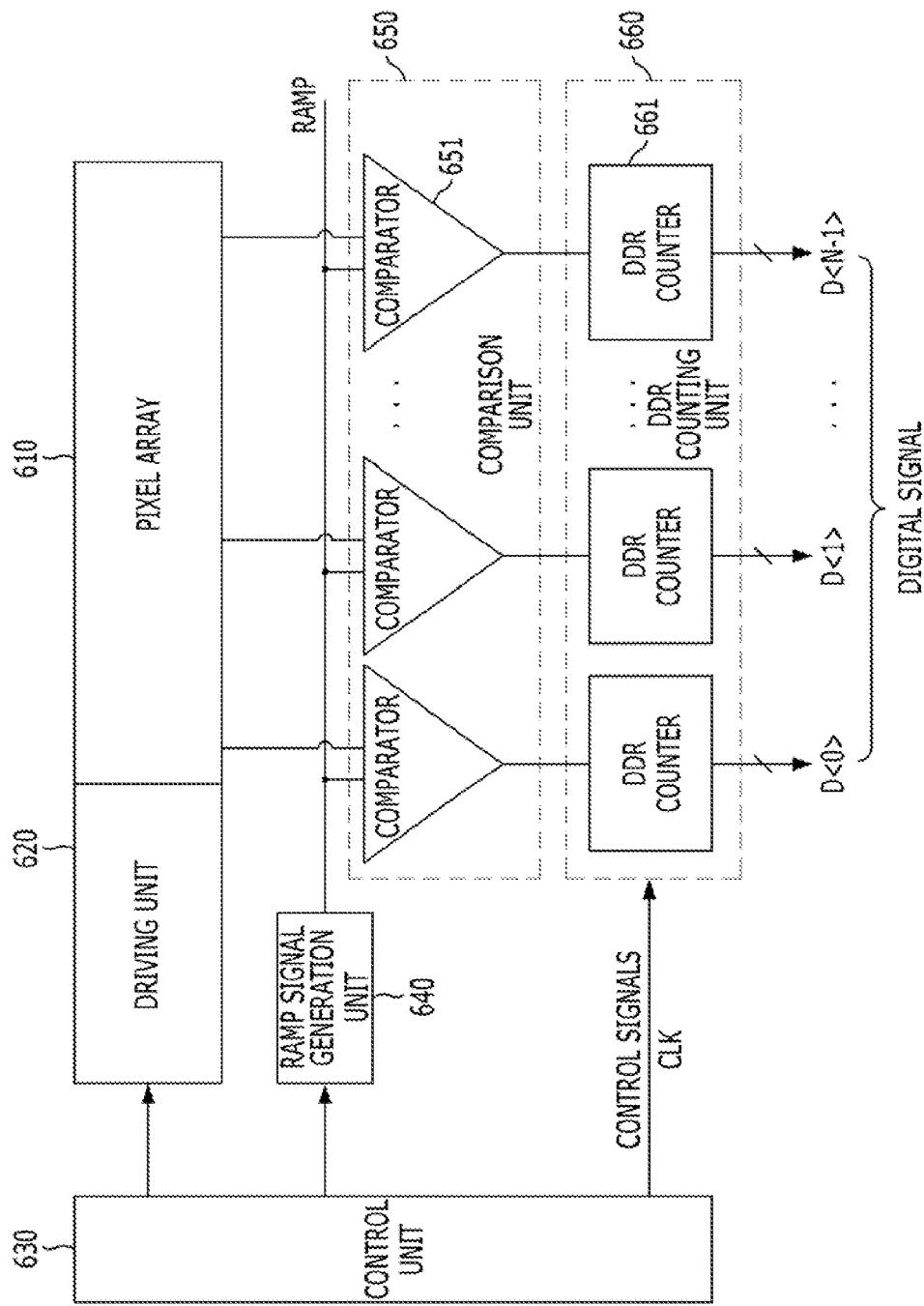
FIG. 5 is a block diagram illustrating a CMOS image sensor in accordance with an embodiment of the present invention.

In order to perform DDS in a single-direction counting method, a CMOS image sensor may be implemented with DDR counters 661, instead of the general counters 161 of FIG. 1, as illustrated in FIG. 5.

FIG. 5 is a block diagram illustrating a CMOS image sensor in accordance with an embodiment of the present invention.

Referring to FIG. 5, the CMOS image sensor may include a pixel array 610, a driving unit 620, a control unit 630, a ramp signal generation unit 640, a comparison unit 650, and a DDR counting unit 660.

The pixel array 610 includes pixels, which are arranged to convert incident light into electrical analog signals. The driving unit 620 may include a driver and an address decoder, and may control the operations of the pixel array by a unit of a row and/or a column. The control unit 630 generates clock and control signals for controlling operation timings of the respective units of the CMOS image sensor. The clock and control signals generated from the control unit 630 may include a count clock signal CNT_CLK, a count mode signal CNT_MODE, a count blocking signal CNT_BLOCK, a flip-flop initialization signal INIT and the like. The ramp signal generation unit 640 generates a ramp signal RAMP, which is used in the comparison unit 650 as a reference signal, according to the control of the control unit 630.

The analog pixel signal read from the pixel array 610 is compared to the ramp signal RAMP (i.e., reference signal) from the ramp signal generation unit 640, and converted into a digital signal D<0:N−1> by counting the compared result, by an analog-to-digital converting apparatus including the comparison unit 650 and the DDR counting unit 660. The pixel signal is outputted and processed by a unit of a column. For this operation, the comparison unit 650 and the DDR counting unit 660 may include a plurality of comparators 651 and a plurality of DDR counters 661, respectively. The CMOS image sensor may process pixel signals corresponding to a row in parallel at the same time, by using the comparators 651 and the DDR counters 661 provided for each column. Thus, the CMOS image sensor may exhibit excellent band performance and noise characteristics, and may operate at a high speed.

The pixel array 610 sequentially outputs a first analog signal indicating a reset component for CDS and a second analog signal indicating an image signal component, which includes a reset component, and the analog-to-digital converting apparatus including the comparison unit 650 and the DDR counting unit 660 digitally performs CDS, (i.e., DDS) based on the first and second analog signals. The DDS is used to remove a deviation among columns of the single-slope ADC having a column-parallel structure.

As such, the analog-to-digital converting apparatus counts the first analog signal indicating a reset component, and then counts the second analog signal indicating an image signal component. Based on the two counting results, a digital signal corresponding to a difference between the first and second analog signals is generated. Each of the two counting processes is performed according to the above-described DDR counting method.

Since the CMOS image sensor performs DDS using the DDR counters 661 having an operation speed twice that of general counters, the CMOS image sensor may have improved operation speed and margin with reduced power consumption.

FIGS. 6A to 6D are timing diagrams of the CMOS image sensor of FIG. 5, illustrating timings when the DDR counter of FIG. 4 is applied to the CMOS image sensor of FIG. 5.

The DDR counter of the embodiment of the present invention counts the count clock signal CNT_CLK to use the counted clocks as the LSB clock signal LSB_CLK when the count mode signal CNT_MODE and the comparator output signal CMP_OUT are at a high level and the count mode signal CNT_MODE and the comparator output signal CMP_OUT are at a low level.

The first counting is performed when the comparator output signal CMP_OUT and the count mode signal CNT_MODE have a high level. The second counting is performed when the comparator output signal CMP_OUT and the count mode signal CNT_MODE have a low level.

When the count mode signal CNT_MODE is at a high level, the NAND gate 412 outputs an output signal having a high level. The switch 413 is then turned on by the high level output signal of the NAND gate 412 and the count clock signal CNT_CLK is transferred to the second NOR gate in the second control block 420 and the D F/F in the sampling block 440. The second NOR gate 422 outputs the LSB clock signal LSB_CLK in response to an low level output signal from the first NOR gate 421 and the switch 424 is turned on to output the LSB clock signal LSB_CLK to the counting block 450 in response to the count mode signal CNT_MODE.

Since the LSB clock signal LSB_CLK from the switch 424 is at a high level, the T F/F is disabled in the counting block 450 when the AND gate 433 outputs a low level output signal. When the comparator output signal CMP_OUT transits from a low level to a high level, the sampling block 440 samples the LSB clock signal LSB_CLK as a LSB data D[0].

Figure 6A:
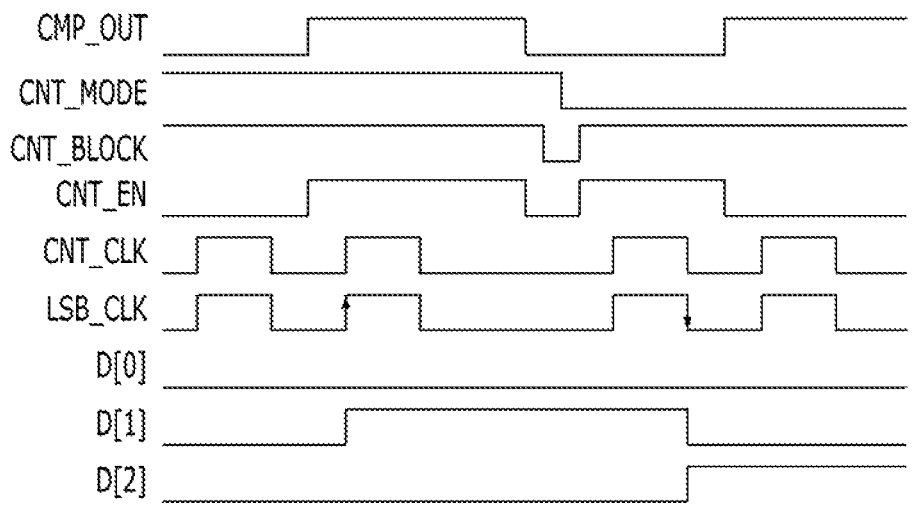
FIGS. 6A to 6D are timing diagrams for explaining the operation of the DDR counter shown in FIG. 4.
Figure 6B:
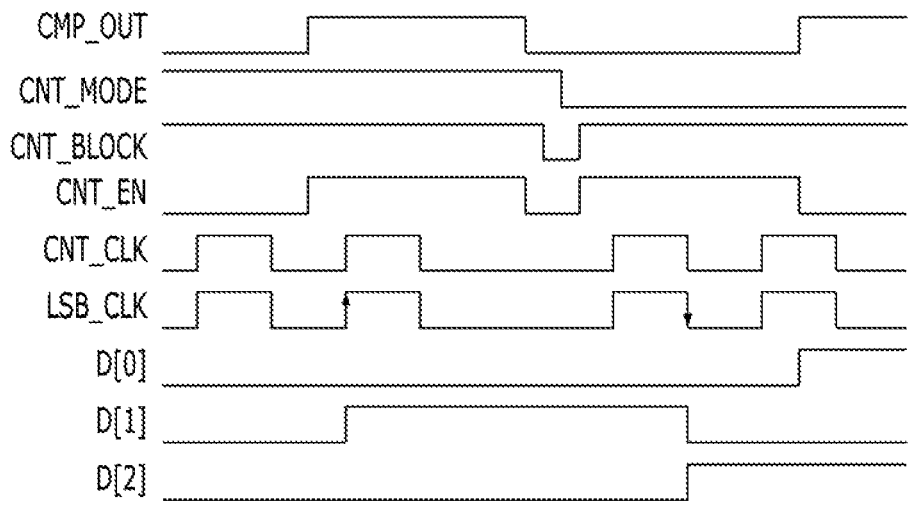

FIGS. 6A and 6B disclose sampling results of a low level LSB clock signal LSB_CLK.

Figure 6C:
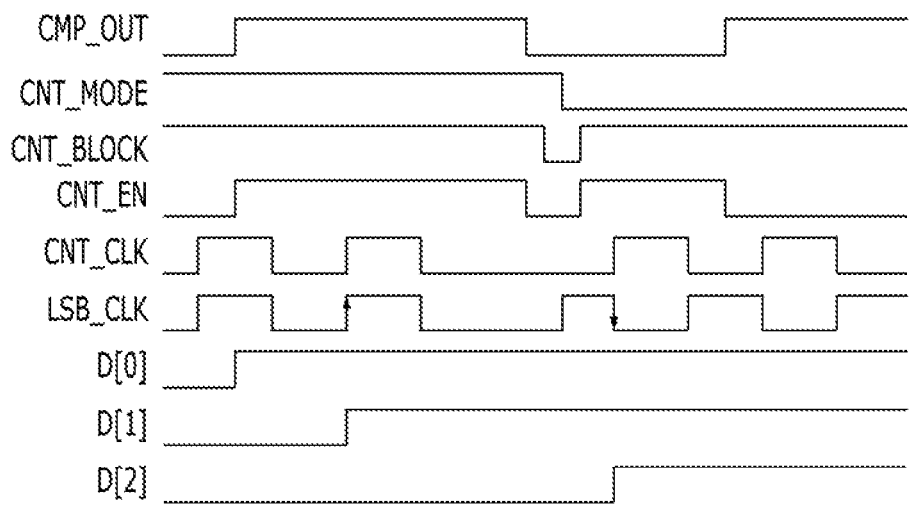
Figure 6D:
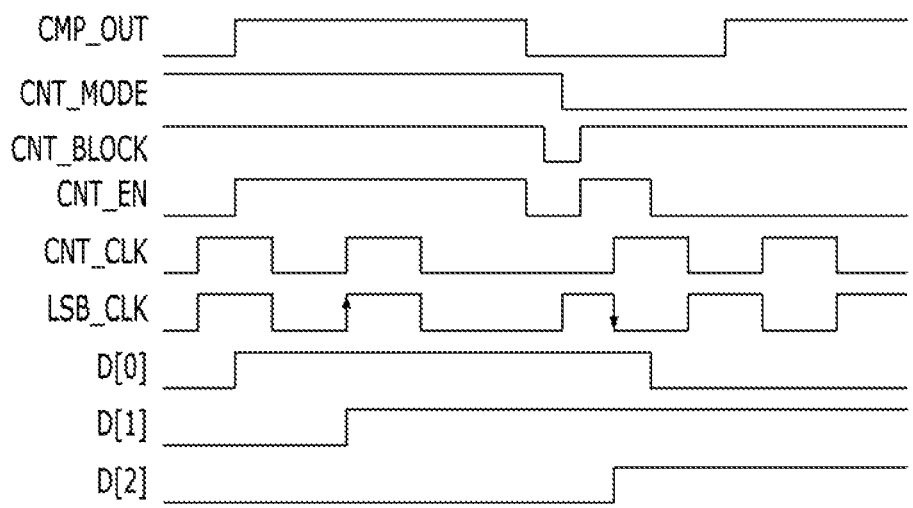

Since the LSB clock signal LSB_CLK transits from a low level to a high level after the counting block 450 is enabled, the LSB data D[1] is 1. FIGS. 6C and 6D disclose sampling results when the LSB clock signal LSB_CLK is at a high level. Since the LSB clock signal LSB_CLK transits from a low level to a high level after the counting block 450 is enabled, the LSB data D[1] is 1.

To count the count clock signal CNT_CLK when the comparator output signal CMP_OUT is at a low level, between the first counting and the second counting, the count mode signal CNT_MODE transits from a high level to a low level. To prevent enabling of the counting block 450, the count blocking signal CNT_BLOCK maintains a low level even though the LSB clock signal LSB_CLK is toggled.

In FIGS. 6A and 6B, whether the count clock signal CNT_CLK is toggled or not in the second counting is determined in response to D[0] sampled in the first counting. For example, the NAND gate 412 outputs a high level output signal since the previous counting value D[0] is '0' and the count rode signal CNT_MODE maintains a high level in the first counting.

The switch 413 outputs the inverted count clock signal CNT_CLK since the previous counting value D[0] is '1'. That is, a first T F/F in the counting block 450 is enabled in the first counting when the comparator output signal CMP_OUT transits from a low level to a high level. The first T F/F in the counting block 450 is enabled in the second counting when the comparator output signal CMP_OUT transits from a high level to a low level.

Although the count mode signal CNT_MODE is a low level, the second NOR gate 422 outputs the LSB clock signal LSB_CLK since the comparator output signal CMP_UT is a low level.

The first T F/F in the counting block 450 is enabled in the second counting when the comparator output signal CMP_OUT is a low level and the count enable signal CNT_EN is a high level.

The D F/F in the sampling block 440 samples the LSB clock signal LSB_CLK as data D[0] and the counting block 450 stop the sampling operation in response to an outputs signal having a low level from the AND gate 433 when the comparator output signal CMP_OUT transits from a low level to a high level. The second NOR gate 422 outputs a signal having a low level by the output signal having a high level from the first NOR gate 421, to reduce power consumption of the inverter 423, the switch 424, and the counting block 450 while the LSB clock signal LSB_CLK is toggling.

In accordance with the embodiments of the present invention, the single-direction counting method does not include a logic circuit for each counting stage. This is in contrast to the up-counting method and the BWI method. Thus, a high-speed operation may be performed and the occupied circuit area may be reduced. Furthermore, the DDR counting method may be applied to halve the clock speed through additional logics, without using an additional logic circuit, in the counting path. Thus, the speed of the CMOS image sensor may be improved and power consumption may be reduced Although various embodiments have been described for illustrative purposes, they are for example only and not intended to limit the scope of the inventive concept. It will be apparent to those skilled in the art that various changes and modifications may be made without departing from the spirit and scope of the invention as defined in the following claims.

What is claimed is:

1. A double data rate (DDR) counter comprising:
   a first control block suitable for toggling a counter clock according to a count mode signal and a previous state value of a sampling block;
   a second control block suitable for determining whether to toggle a clock signal inputted to a counting block corresponding to an (LSB+1) bit or higher; and
   a third control block suitable for determining an enable period of the counting block;
   wherein said sampling block is suitable for sampling a state of the clock signal and outputting an LSB value when an input signal transits; and
   wherein said counting block is suitable for performing counting according to output signals of the second and third control blocks and outputting a counter output signal having the (LSB+1) bit or higher.

2. The DDR counter of claim 1, wherein the first and second control blocks determine whether to toggle the clock signal between first and second counting operations.

3. The DDR counter of claim 1, wherein the counting block performs counting at rising edges of the clock signal from the (LSB+1) bit during a first counting operation, and performs counting at falling edges of the clock signal from the (LSB+1) bit during a second counting operation.

4. The DDR counter of claim 1, wherein the third control block disables the counting block corresponding to the (LSB+1) bit such that counting operation for the (LSB+1) bit or higher is not performed by transition of the clock signal.

5. The DDR counter of claim 4, wherein the third control block disables the counting block by using a count blocking signal.

6. The DDR counter of claim 1, wherein the first control block comprises:
a first inverter suitable for inverting a count clock signal;
a first NAND gate suitable for performing a NAND operation on a signal obtained by inverting the count mode signal and the previous state value of the sampling block; and
a first switch suitable for selecting the count clock signal or the inverted count clock signal as an LSB clock signal according to an output signal of the NAND gate.

7. The DDR counter of claim 6, wherein the second control block comprises:
a first NOR gate suitable for performing a NOR operation on the count mode signal and a signal obtained by inverting the input signal;
a second NOR gate suitable for performing a NOR operation on the LSB clock signal and an output signal of the first NOR gate;
a second inverter suitable for inverting an output signal of the second NOR gate; and
a second switch suitable for selecting the output signal of the second NOR gate or the signal inverted by the second inverter as the clock signal inputted to the counting block according to the count mode signal.

8. The DDR counter of claim 4, wherein the third control block comprises:
a third inverter suitable for inverting the input signal;
a third switch suitable for selecting the input signal or the inverted input signal according to the count mode signal; and
a second NAND gate suitable for performing a NAND operation on the signal selected by the third switch and the count blocking signal and outputting a count enable signal to the counting block.

9. An analog-to-digital converting apparatus comprising:
a comparator suitable for comparing an analog signal to a reference signal and generating a comparator output signal; and
a DDR counter suitable for generating a digital signal corresponding to the analog signal according to the comparator output signal,
wherein the DDR counter comprises:
a first control block suitable for toggling a counter clock according to a count mode signal and a previous state value of a sampling block;
a second control block suitable for determining whether to toggle a clock signal inputted to a counting block corresponding to an (LSB+1) bit or higher; and
a third control block suitable for determining an enable period of the counting block;
wherein said sampling block is suitable for sampling a state of the clock signal and outputting an LSB value, when the comparator output signal transits; and
wherein said counting block is suitable for performing counting according to output signals of the second and third control blocks and outputting a counter output signal having the (LSB+1) bit or higher.

10. The analog-to-digital converting apparatus of claim 9, wherein the first and second control blocks determine whether to toggle the clock signal between a first counting operation and a second counting operation.

11. The analog-to-digital converting apparatus of claim 9, wherein the counting block performs counting at rising edges of the clock signal from the (LSB+1) bit during a first counting operation, and performs counting at falling edges of the clock signal from the (LSB+1) bit during a second counting operation.

* * * * *